United States Patent
Lamborghini et al.

(10) Patent No.: US 8,324,910 B2
(45) Date of Patent: Dec. 4, 2012

(54) TOUCH SENSOR SYSTEM

(75) Inventors: Louis R. Lamborghini, Smithfield, RI (US); Benjamin K. Yuen, Allston, MA (US); Thomas E. Babington, North Dartmouth, MA (US)

(73) Assignee: Stoneridge Control Devices, Inc., Canton, MA (US)

( * ) Notice: Subject to any disclaimer, the term of this patent is extended or adjusted under 35 U.S.C. 154(b) by 696 days.

(21) Appl. No.: 12/397,605

(22) Filed: Mar. 4, 2009

(65) Prior Publication Data
US 2009/0160529 A1 Jun. 25, 2009

Related U.S. Application Data

(62) Division of application No. 11/311,432, filed on Dec. 19, 2005, now Pat. No. 7,518,381.

(60) Provisional application No. 60/637,098, filed on Dec. 17, 2004.

(51) Int. Cl.
*G01R 27/26* (2006.01)
*G06F 3/041* (2006.01)

(52) U.S. Cl. ........................ 324/658; 345/173

(58) Field of Classification Search .............. 324/713, 324/649, 600, 679, 658, 691; 323/904; 327/517; 345/173; 348/14.03; 379/93.19; 399/185; 463/37
See application file for complete search history.

(56) References Cited

U.S. PATENT DOCUMENTS

| | | | |
|---|---|---|---|
| 4,093,992 A * | 6/1978 | Kawamura et al. ........... | 708/111 |
| 4,107,555 A | 8/1978 | Haas et al. | |
| 4,228,534 A | 10/1980 | Fellrath et al. | |
| 4,698,460 A | 10/1987 | Krein et al. | |
| 4,701,747 A | 10/1987 | Isherwood et al. | |
| 4,733,222 A * | 3/1988 | Evans ............................. | 341/33 |
| 5,917,165 A | 6/1999 | Platt et al. | |
| 6,140,987 A | 10/2000 | Stein et al. | |
| 6,259,045 B1 | 7/2001 | Imai | |
| 6,664,489 B2 | 12/2003 | Kleinhans et al. | |
| 6,723,937 B2 | 4/2004 | Englemann et al. | |
| 6,847,289 B2 | 1/2005 | Pang et al. | |
| 7,254,775 B2 | 8/2007 | Geaghan et al. | |
| 7,362,313 B2 | 4/2008 | Geaghan et al. | |

(Continued)

FOREIGN PATENT DOCUMENTS
DE 2749512 5/1978
(Continued)

OTHER PUBLICATIONS

German Office Action dated Sep. 23, 2010 issued in related German Patent Application No. 112005003178.0-56.

(Continued)

*Primary Examiner* — Hoai-An D Nguyen
(74) *Attorney, Agent, or Firm* — Grossman, Tucker, Perreault & Pfleger, PLLC

(57) ABSTRACT

A touch sensor assembly. The touch sensor assembly may include a housing, at least one touch sensor and a sensor cover. The sensor cover may identify a touch area associated with each touch sensor. The housing may form a water tight cavity for the sensor cover and the touch sensor when coupled to an housing cover. A raised dome may be provided, e.g. on the sensor cover or another element, to provided tactile feed back. LEDs may be provided for illuminating the touch areas and/or sensing ambient light. A controller may control the illumination level of the LEDs in response to sensed ambient light. Adjacent key suppression algorithms are also provided.

18 Claims, 18 Drawing Sheets

U.S. PATENT DOCUMENTS

| | | | |
|---|---|---|---|
| 7,518,381 B2 | 4/2009 | Lamborghini | |
| 2002/0167704 A1 | 11/2002 | Kleinhans | |
| 2003/0063073 A1 | 4/2003 | Geaghan et al. | |
| 2003/0107473 A1 | 6/2003 | Pang | |
| 2003/0133269 A1 | 7/2003 | Cox et al. | |
| 2003/0223799 A1* | 12/2003 | Pihlaja | 400/490 |
| 2004/0140993 A1 | 7/2004 | Geaghan et al. | |
| 2004/0247484 A1 | 12/2004 | Yerazunis | |
| 2005/0073507 A1* | 4/2005 | Richter et al. | 345/174 |
| 2005/0259378 A1 | 11/2005 | Hill | |
| 2006/0105671 A1* | 5/2006 | Connolly | 446/485 |
| 2006/0221061 A1 | 10/2006 | Fry | |
| 2006/0267953 A1 | 11/2006 | Peterson et al. | |
| 2007/0024591 A1 | 2/2007 | Fry | |
| 2007/0024592 A1 | 2/2007 | Fry | |

FOREIGN PATENT DOCUMENTS

| | | |
|---|---|---|
| DE | 3611988 | 10/1986 |
| DE | 8813185 | 2/1989 |
| DE | 3901649 | 4/1995 |
| DE | 10051055 | 5/2002 |
| DE | 10123633 | 2/2003 |
| DE | 69907017 | 2/2004 |
| GB | 2295486 | 5/1996 |
| WO | 0034068 | 6/2000 |
| WO | 03/102988 | 12/2003 |

OTHER PUBLICATIONS

International Search Report and Written Opinion mailed Sep. 14, 2007 in connection with corresponding PCT Patent Application No. PCT/US05/45636.

* cited by examiner

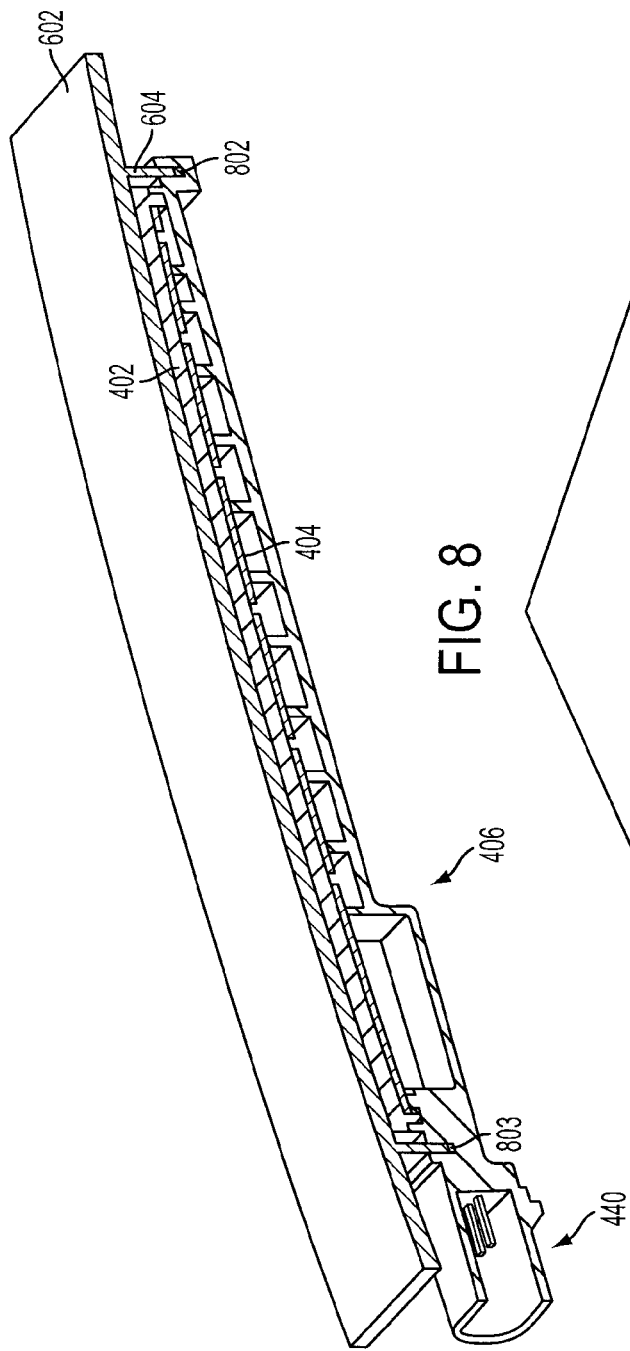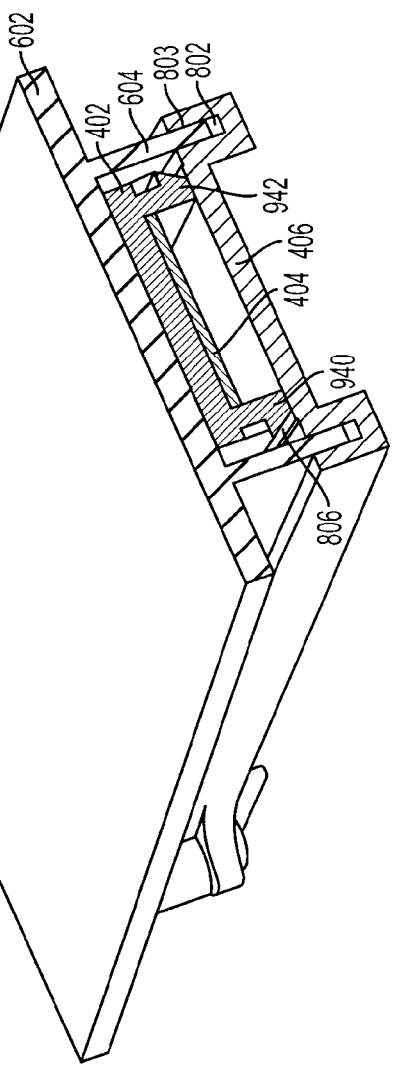

TOUCH SENSOR SYSTEM

CROSS-REFERENCE TO RELATED APPLICATIONS

The present application is a divisional of U.S. patent application Ser. No. 11/311,432, filed Dec. 19, 2005, which claims the benefit of U.S. provisional application Ser. No. 60/637,098, filed Dec. 17, 2004, the entire disclosures of which are incorporated herein by reference.

TECHNICAL FIELD

This disclosure relates to touch sensor systems and methods.

BACKGROUND

A vehicle may include assemblies for controlling activation or deactivation of a device. The automotive industry has required that such devices provide tactile feedback to a user to indicate when a function has been activated or deactivated. Tactile feedback may be achieved using associated mechanical components, such as a spring and lever in an "over the center" snap-acting arrangement (e.g. in a rocker mechanism), or by the use of other known tactile feedback configurations.

These configurations typically require several components and features. Some of the components may be difficult and expensive to manufacture. For example, a pivot race and pivot shaft for a rocker button may have narrow tolerances and require a highly polished surface to reduce frictional forces. Conventional assemblies may thus involve complex design, high costs, and reduced reliability. In addition, consumer preferences are leading automobile manufacturers to more streamlined and unobtrusive systems.

At least in part to address these issues, touch sensor configurations have been adopted. As used herein the term "touch sensor" refers to a sensor configuration that provides an output in response to contact with a touch area without requiring movement of a mechanical component to electrically close or open associated contacts. Numerous analog and digital touch sensor configurations are well-known to those of ordinary skill in the art. Known touch sensors use techniques such as resistive sensing, capacitive sensing, acoustic sensing, magnetic sensing, optical sensing, etc., to providing an output in response to contact with a touch area.

Touch sensor configurations may be less expensive compared conventional mechanical switch devices, may require less space for installation, and may be more aesthetically pleasing. Typically, however, touch sensor configurations have not provided tactile feedback. Also, in multiple sensor configurations cross-talk between adjacent touch sensors may prevent or delay proper system operation, and conventional touch sensor systems may be challenged by harsh environmental conditions, e.g. rain, ice, extreme temperature, vibration, etc.

BRIEF DESCRIPTION OF THE DRAWINGS

Features and advantages of embodiments of the disclosed subject matter will become apparent as the following Detailed Description proceeds, and upon reference to the Drawings, where like numerals depict like parts, and in which:

FIG. 8 is a sectional view of the appliqué and touch sensor assembly of FIG. 7 taken along the line 8-8 of FIG. 7;

FIG. 9 is a sectional view of the appliqué and touch sensor assembly of FIG. 7 taken along the line 9-9 of FIG. 7;

Although the following Detailed Description will proceed with reference being made to illustrative embodiments, many alternatives, modifications, and variations thereof will be apparent to those skilled in the art. Accordingly, it is intended that the claimed subject matter be viewed broadly.

DETAILED DESCRIPTION

Embodiments presented herein are described with reference to an automotive application. It is to be understood, however, that the embodiments described herein are presented by way of illustration, not of limitation. For example, a touch sensor system consistent with the present invention may be used in any of a variety of systems, e.g. in consumer and industrial equipment or appliances, for enabling a user input to switch or control functions and/or to input data.

Figure 1:
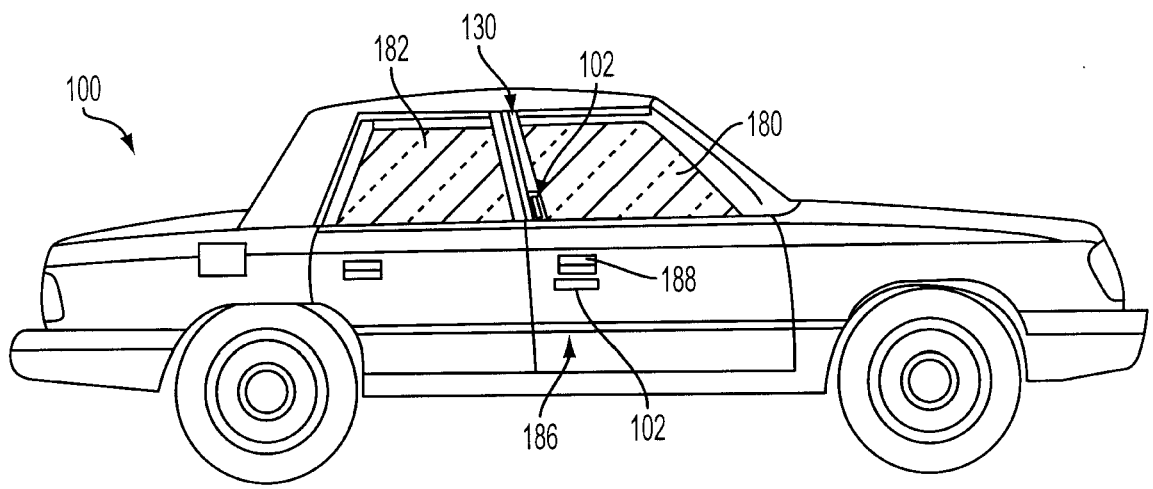
FIG. 1 is a perspective view of a vehicle incorporating touch sensor assemblies consistent with the present disclosure.
Figure 2:
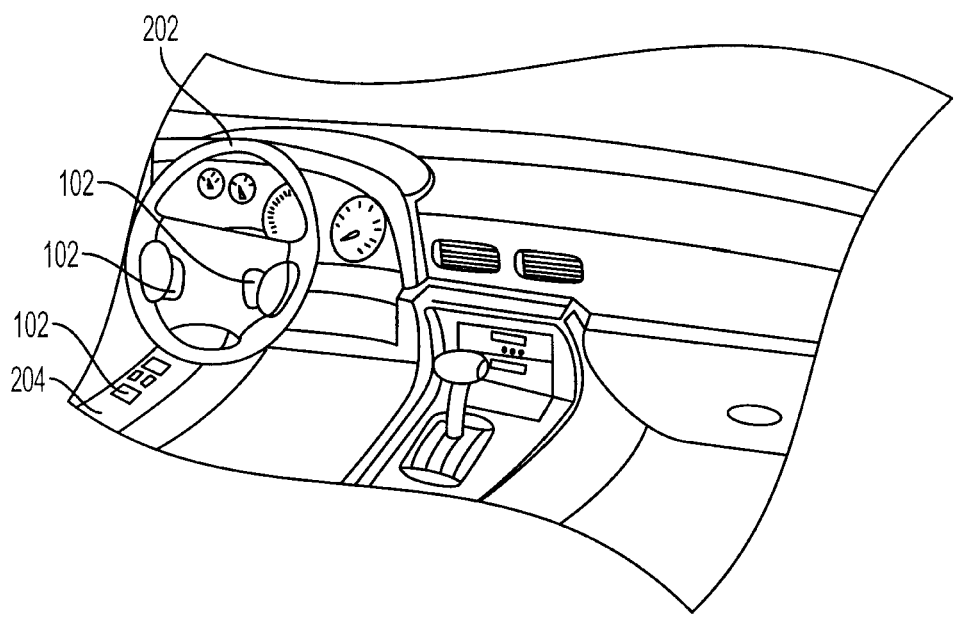
FIG. 2 is a partial view of the interior cabin area of the vehicle of FIG. 1.

FIGS. 1 and 2 illustrate a touch sensor assembly consistent with the present disclosure utilized at the exterior and interior of a vehicle 100. A touch sensor assembly consistent with the present disclosure may, for example, be provided as a user interface portion of a keyless vehicle entry system. Keyless entry systems are well-known and generally allow a user to unlock a door, e.g. a vehicle or building door, by entering a code on a user interface associated with the door. An output of the user interface may be provided to a controller configured to unlock the associated door upon entry of a predefined code at the user interface. In vehicle entry system, a touch sensor assembly 102 consistent with the present disclosure may be affixed on or proximate the B-pillar area 130 of the vehicle, as shown in FIG. 1. In addition, or alternatively, a touch sensor assembly 102 consistent with the present disclosure may be located on the front door 186 proximate a door handle 188. As shown in FIG. 2, one or more touch sensors 102 may be located on a vehicle steering wheel 202 and/or on the inside arm rest portion 204 of the driver's side door. A touch sensor consistent with the present disclosure may also be provided on a surface of the instrument panel.

Figure 3:
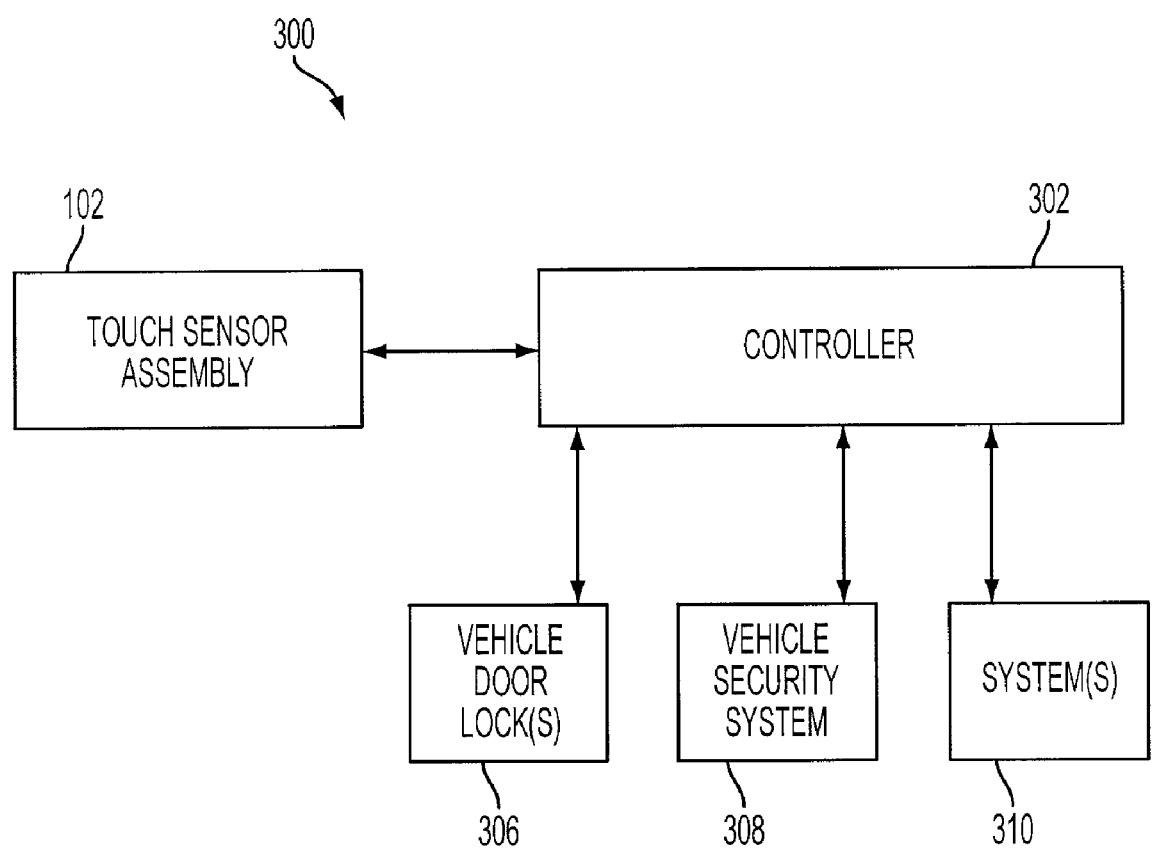
FIG. 3 is a block diagram of a touch sensor system that may be utilized in the vehicle of FIG. 1.

FIG. 3 illustrates in block diagram form one exemplary embodiment of a touch sensor system 300 including a touch sensor assembly 102, a controller 302, and one or more vehicle systems 306, 308, 310 coupled to the controller 302. The touch sensor assembly 102 may include one or more known touch sensors, e.g. employing resistive sensing, capacitive sensing, acoustic sensing, magnetic sensing, optical sensing, etc., to provide an output in response to contact with a touch area. Combinations of touch sensors may be used to provide redundancy.

In operation, a user may cause contact, either directly or indirectly, with one or more of the touch areas, causing the assembly 102 to provide an associated output. The output of the assembly 102 may be coupled, e.g. via a vehicle CAN bus, to the controller 302. The controller may be responsive to the output to control one or more systems, e.g. vehicle door lock(s), vehicle security system 308, and/or another system 310, such as a vehicle sound system, climate control system, etc. For example, in an embodiment wherein the touch sensor system 300 is configured as a vehicle entry system, the controller 315 may be responsive to signals from the assembly 102 to control the vehicle door locks 305 to lock or unlock one or more doors.

Figure 4:
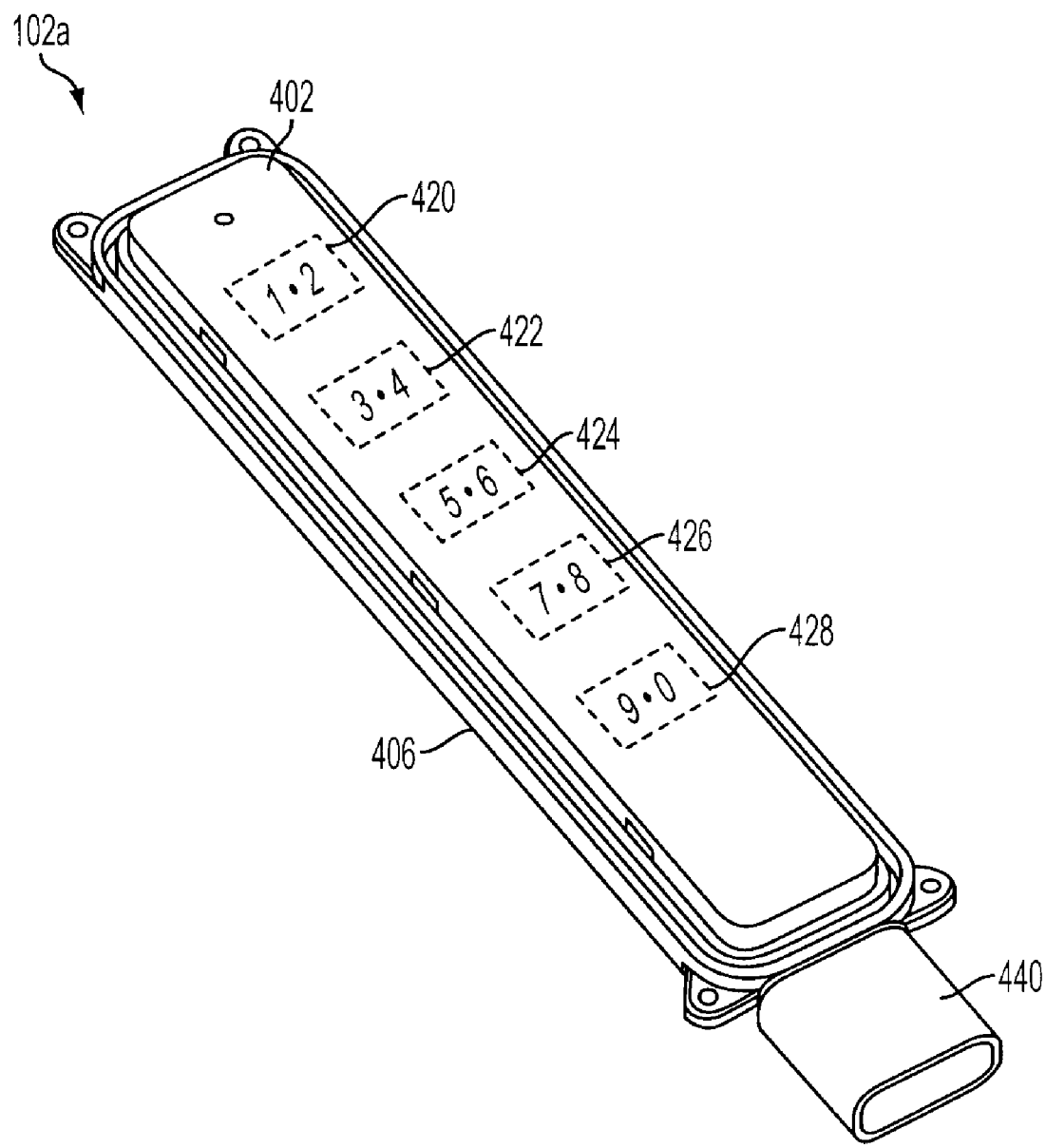
FIG. 4 is a perspective view a touch sensor assembly.

FIG. 4 is a perspective view of one exemplary embodiment 102a of a touch sensor assembly that may be installed at the exterior of a vehicle, e.g., on the B-pillar or adjacent a door handle as shown in FIG. 1, for use in connection with a vehicle entry system. The touch sensor assembly 102a may include a sensor cover 402 visible to a user. The sensor cover 402 may identify a plurality of touch areas using alpha-numeric and/or other graphics. In the illustrated exemplary embodiment, a first touch area 420 is indicated by numerals 1 and 2, a second touch area is indicated by numerals 3 and 4, a third touch area 424 is indicated by numerals 5 and 6, a fourth touch area 426 is indicated by numerals 7 and 8, and a fifth touch area 428 is indicated by numerals 9 and 0.

Figure 5:
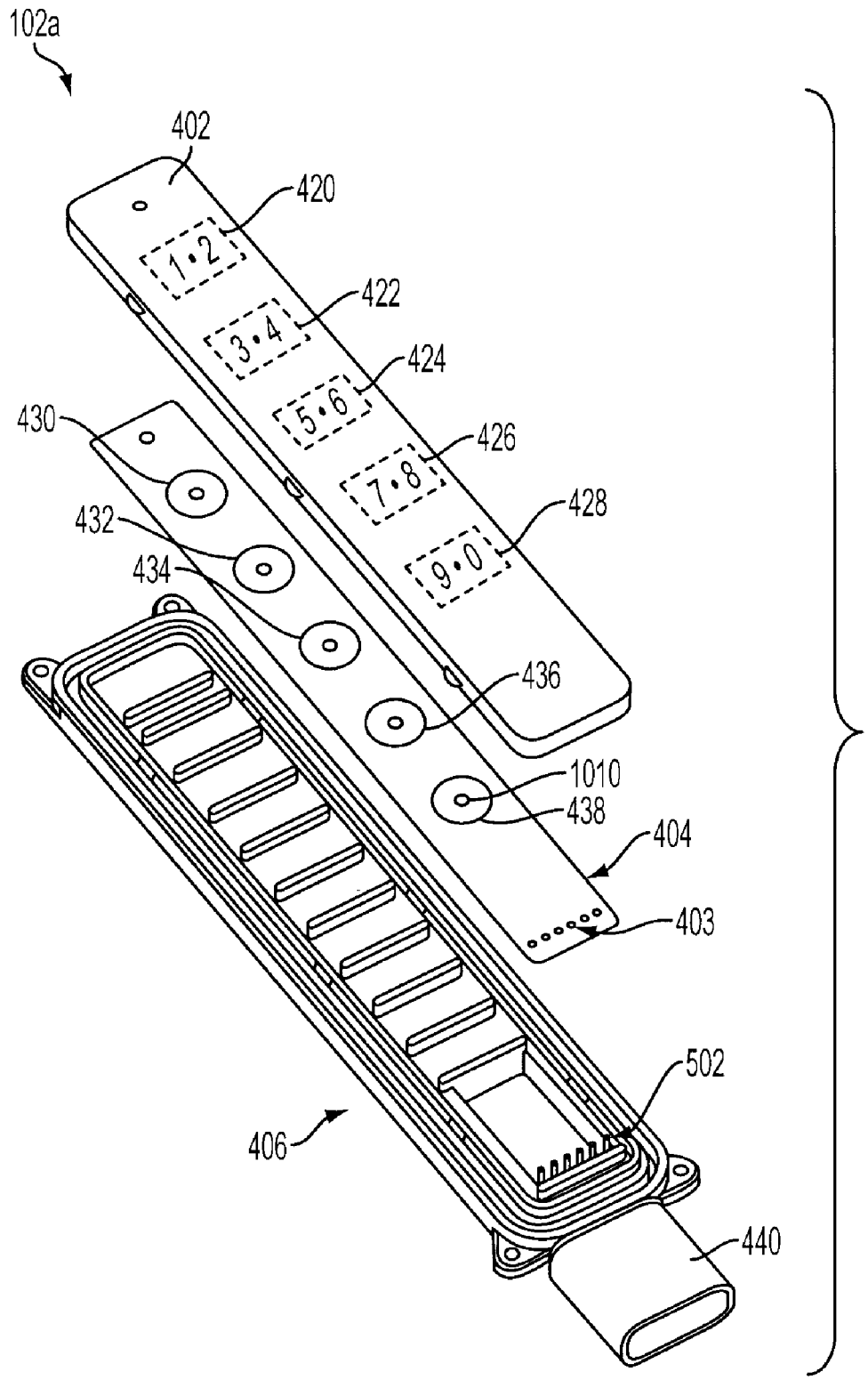
FIG. 5 is an exploded view of the touch sensor assembly of FIG. 4.

As shown in the exploded view of FIG. 5, each of the touch areas 420, 422, 424, 426, and 428 may be associated with a corresponding touch sensor 430, 432, 434, 436, and 438, respectively, whereby contact with the surface of the sensor cover in a touch area causes the corresponding touch sensor to provide an associated output. The touch sensors may be disposed on a printed circuit board (PCB) 404, carrying conductive traces for providing sensor outputs to associated contacts 403.

The PCB 404 and the sensor cover 402 may be configured to be received at least partially within a housing 406 with the PCB disposed between the housing 406 and the sensor cover 402. The housing 406 include a plurality of pins 502 each of which is electrically connected to a corresponding one of the pins 403. The pins 502 may extend to a connector portion 440 for electrically coupling the touch sensor assembly 102a to other components such as the controller 302 of FIG. 3.

Figure 6:
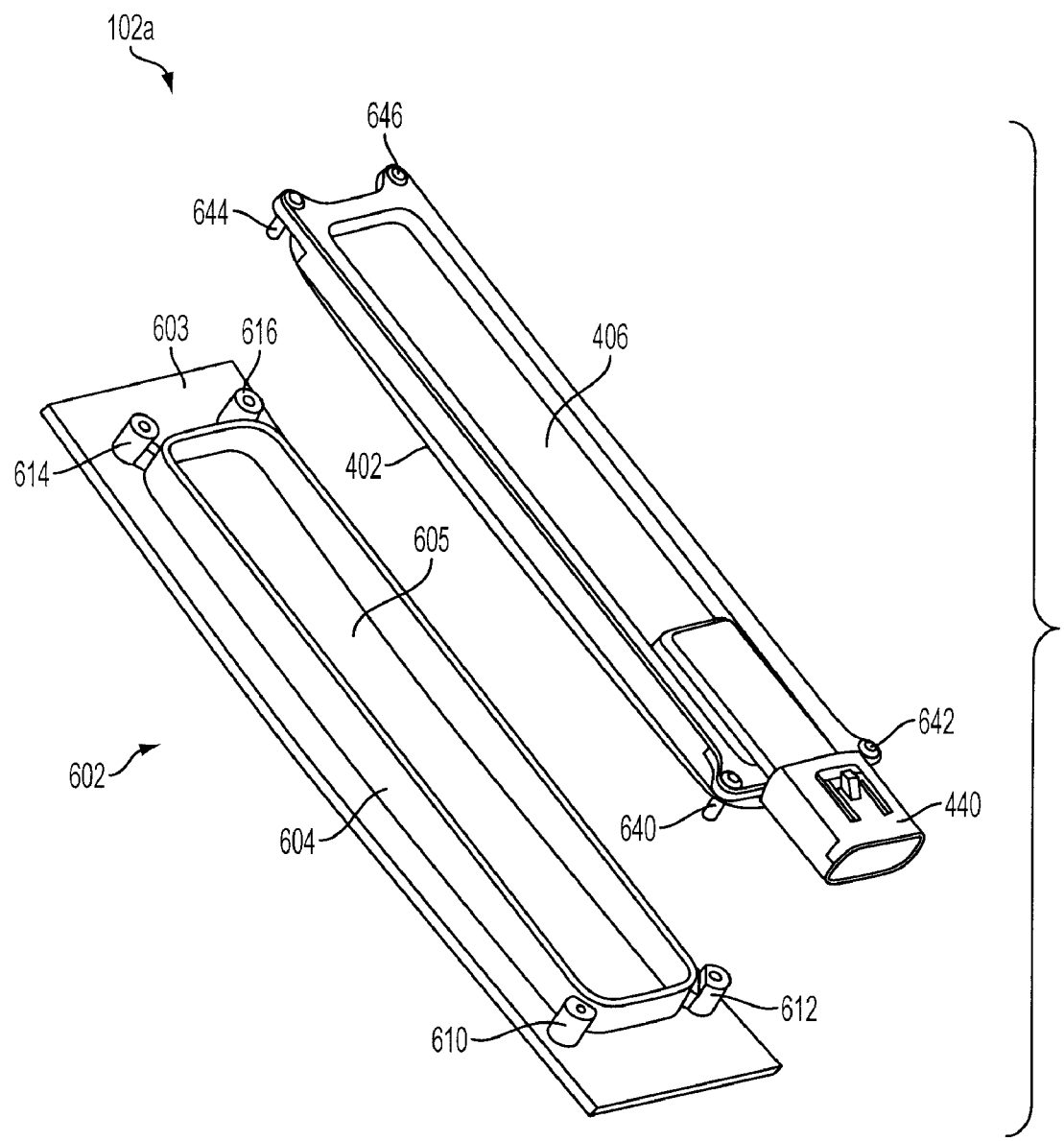
FIG. 6 is a rear perspective view the touch sensor assembly of FIG. 4 for mounting to an appliqué.

FIG. 6 is an exploded view of an assembly touch sensor assembly 102a and a housing cover 602. The housing cover 602 may, for example, be an appliqué attached to the B-pillar area 130 of a vehicle or to the trim area of the front door 186 proximate the front window 180. The housing cover 602 may include a plurality of screw bosses 610, 612, 614, and 616 configured to accept a corresponding plurality of screws 640, 642, 644, and 646 to assist in securing the touch sensor assembly 102a to the rear surface 603 of the housing cover 602. The rear surface 603 of the housing cover 602 may also include a projection 604 configured to mate with a corresponding slot in the housing 406 of the touch sensor assembly 102a. In one embodiment, the projection 604 may be an upstanding wall defining a closed geometry.

The rear surface 603 of the housing cover 602 may include a portion 605 adjacent to the top surface of the sensor cover 402 when the touch sensor assembly 102a is mounted to the housing cover 602. This portion 605 of the housing cover 602 may formed of a sufficiently translucent material to allow viewing of the touch area indicators on the sensor cover when housing cover 602 is coupled to the assembly. The translucent material may be selected so that the touch area indicators on the sensor cover 402 are not readily visible to user unless illuminated by a light source of the switch assembly 102a. In this way, the housing cover 602 may mask the sensor cover 402 until the touch sensor assembly 102a is activated, e.g., by touching the housing cover 602 at a position above one of the touch areas.

Figure 7:
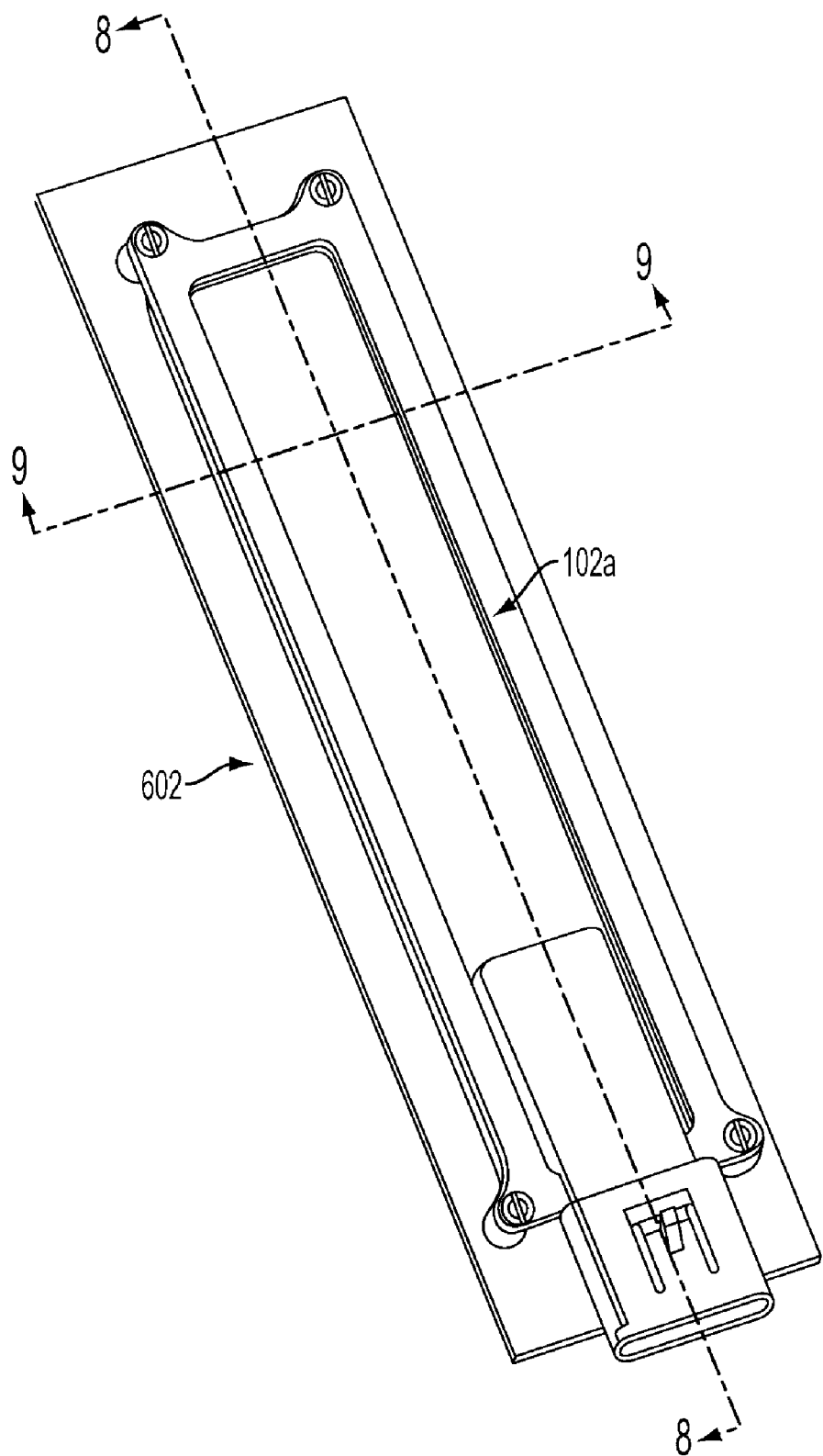
FIG. 7 is a rear perspective view the touch sensor assembly of FIG. 4 mounted to the appliqué of FIG. 6.

FIG. 7 is a rear perspective view of the touch sensor assembly 102a mounted to the rear surface 603 of the housing cover 602. FIG. 8 is a sectional view of the housing cover 602 and touch sensor assembly taken along the line 8-8 of FIG. 7. As shown in FIG. 8, the rear surface of the housing cover 602 may contact the top surface of the sensor cover 402 to minimize the distance between the housing cover and the sensing circuitry of the PCB 404. The rear surface of the sensor cover 402 may contact the touch sensors on the PCB 404. The upstanding wall 604 of the housing cover 602 may be configured to mate with an associated slot 803 of the housing 406. A channel 802 may be provided in the bottom of the slot 803 to accept a gasket and/or an adhesive, for example epoxy, glue, etc. The gasket and/or adhesive may form a seal between the upstanding wall 604 of the housing cover 602 and the associated slot 803.

Turning to FIG. 9, there is provided a sectional view of the housing cover 602 and touch sensor assembly taken along the line 9-9 of FIG. 7. As shown, the sensor cover 402 may include projections 940, 942 to mate with associated portions of the housing 406, e.g. through a snap-fit connection. When the housing cover 602 is properly mounted to the housing 406, a cavity 806 defined by the rear surface 603 of the housing cover 602 and the top surface of the housing 406 may be formed. The cavity 806 may be substantially water tight, and the PCB 404 and the sensor cover 402 may be completely disposed within the cavity 806.

Figure 10:
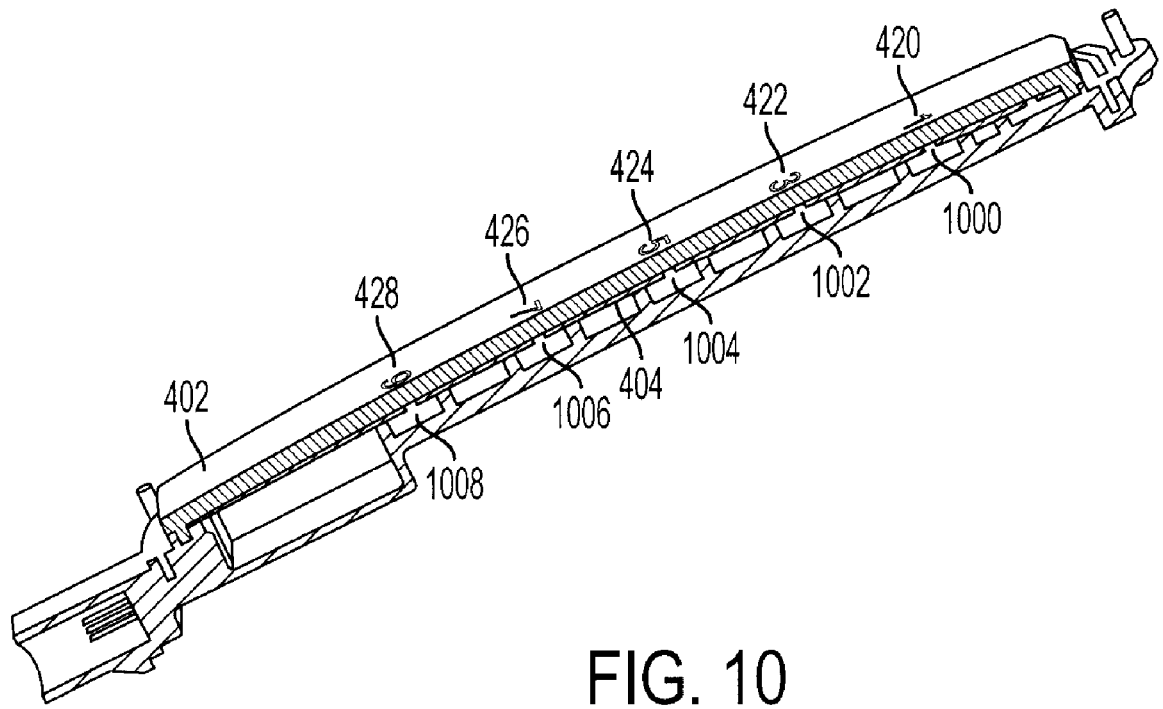
FIG. 10 is a cross-sectional view of the touch sensor assembly of FIG. 4.
Figure 11:
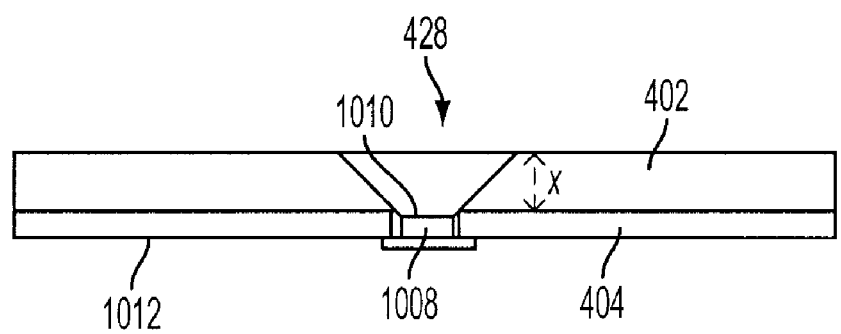
FIG. 11 is a cross-sectional view illustrating mounting of a light emitting diode of FIG. 10.

FIG. 10 is a perspective and cross-sectional view of the touch sensor assembly 102a. As shown, a light emitting diode (LED) 1000, 1002, 1004, 1006, and 1008 may be positioned beneath each of the touch areas 420, 422, 424, 426, and 428 of the sensor cover 402 to provide illumination. Each LED may be mounted to a bottom surface of the PCB 404. FIG. 11, for example, illustrates positioning of the LED 1008 relative to the touch area 428. As shown, the LED may be mounted to the bottom surface 1012 of the PCB 404 with the illumination surface of the LED 1008 spaced a distance x from the touch area 428 to be illuminated. This distance x may be selected depending on the application to achieve a desired illumination coverage area for the touch area 428.

Figure 12:
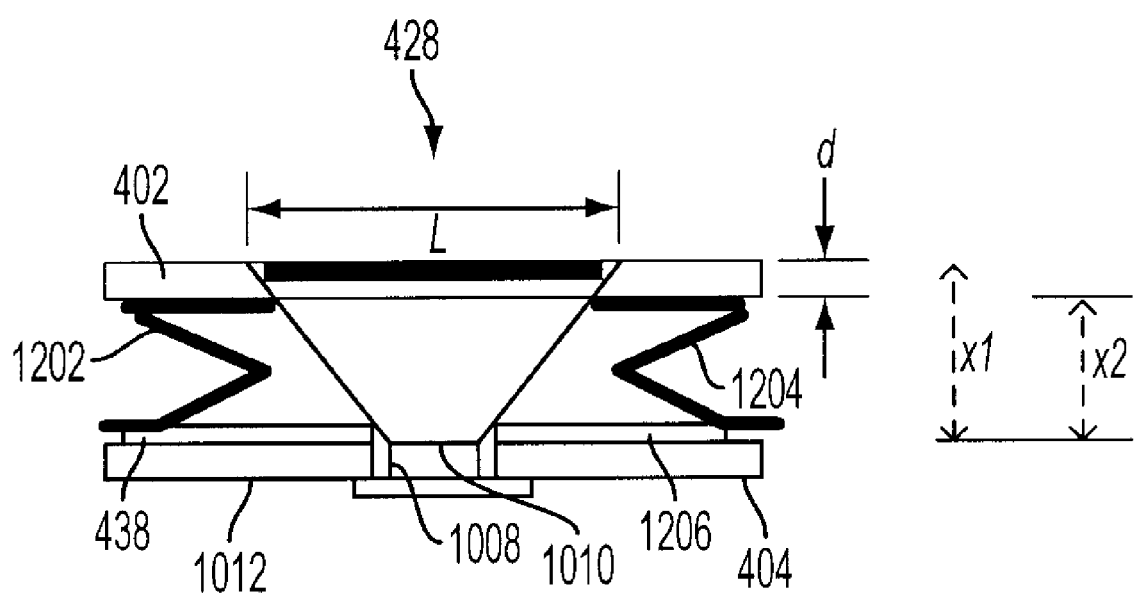
FIG. 12 is a cross-sectional view of another embodiment for providing illumination to a touch area.

FIG. 12 illustrates another LED mounting configuration for providing illumination of the touch areas of the sensor cover 402. In the exemplary embodiment of FIG. 12, the LED is mounted to the bottom surface 1012 of the LED with the illumination surface 1010 of the LED at a distance x1 from the touch area to be illuminated. To maximize the distance x1 to achieve illumination over the length L of the touch area, the thickness d of the sensor cover 402 may be adjusted (e.g. minimized) and the sensor cover may be separated from the PCB by a distance x2. Since separation of the sensor cover 402 from the PCB 404 may adversely affect the capacitive coupling of a touch on the touch area 428 to the associated touch sensor 438, one or more conductors, e.g. conductors 1202 and 1204, may be provided for conductively coupling sensor cover 404 to the touch sensor 438.

In yet another embodiment, one or more of the LEDs may function both as light source and a light sensor to sense an ambient light level, or a separate LED may be provided for sensing ambient light levels. A signal representative of the sensed ambient light may be provided from an LED to an associated controller, e.g., controller 302, which may adjust the light output established by one or more of the LEDs in response thereto. When the touch sensor assembly is not in use, the controller may not drive the LEDs to disable illumination of the sensor cover. When the user touches a touch area, the controller may energize the LEDs to illuminate the touch areas. If the user touches a touch area during high ambient light conditions such as daylight, the controller may drive the LEDs to achieve maximum illumination of the touch areas so the user can read each of the touch areas even in direct sunlight. If the user touches a touch area during low ambient light conditions such as at night, the controller may drive the LEDs to illuminate the sensor cover at a comparatively lower level to provide appropriate light contrast for the user. The controller, e.g., controller 302, may be a component of the touch sensor assembly 102a so that light sensing and regulation may be accomplished within the touch sensor assembly 102a to allow for direct substitution with an existing mechanical entry system.

Figure 13:
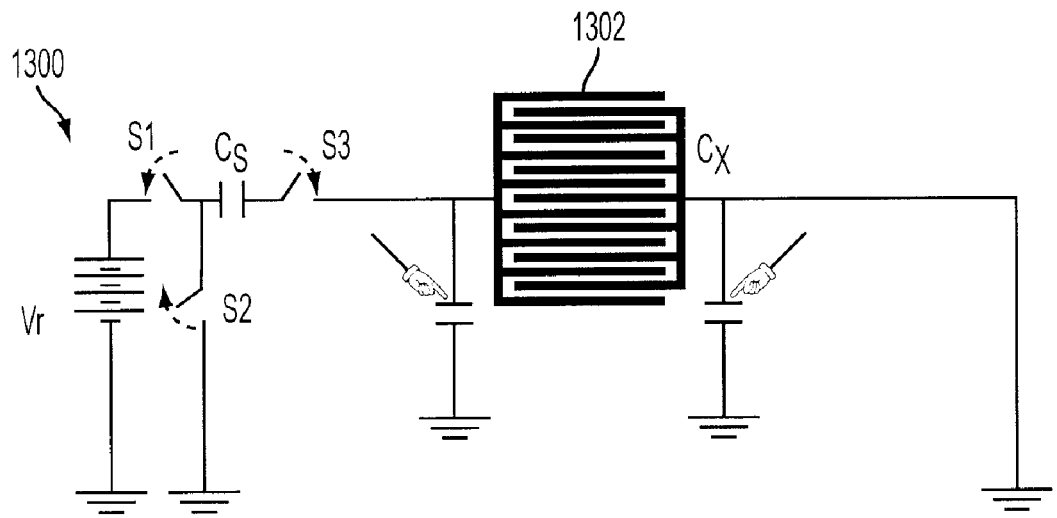
FIG. 13 is a diagram of capacitive circuitry having a capacitance responsive to contact by a user.

FIG. 13 is a circuit diagram of one embodiment of an exemplary touch sensor 1300 useful in a touch sensor assembly consistent with the present disclosure. The touch sensor 1300 may include a plurality of switches S1, S3, S3, a sample capacitor Cs, and an unknown or variable capacitance Cx to be measured. The variable capacitance Cx may initially be the capacitance of the touch sensor 1302 to free space or to an electrical ground. The touch sensor 1302 may include a sense electrode which may further include spaced conductive traces (e.g., hard printed circuit board traces, thin or thick film flex circuitry) in a range of patterns to customize performance. The variable capacitance Cx may change with the proximity of an object thereto, e.g., a finger of the user, which may introduce a parasitic capacitance to ground. The switches S1, S2, and S3 may control charge transfer between capacitances Cx and Cs so that the voltage Vcs across capacitor Cs may be used as an indication of the value of capacitance Cx. Additional and other exemplary capacitive circuitries having a capacitance responsive to the proximity of an object thereto are described in detail in U.S. Pat. No. 6,466,036, the teachings of which are incorporated herein by reference.

Figure 14:
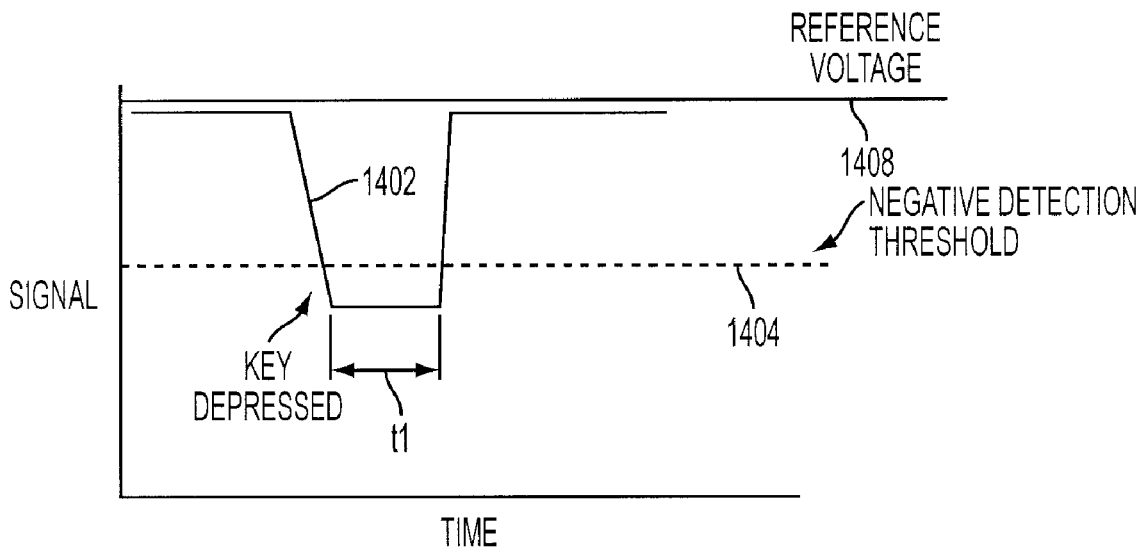
FIG. 14 is a plot of voltage vs. time illustrating the output of an exemplary touch sensor using capacitive circuitry during a touch and non-touch event.

FIG. 14 includes a plot of output voltage vs. time associated with the exemplary touch sensor of FIG. 13. The output of the sensor may be provided to a controller, e.g. controller 302, for controlling an associated function. As shown, if the output voltage maintains a reference voltage level 1408 a non-touch event is assumed. If the output voltage exceeds the negative detection threshold 1404 for a specified time interval, e.g., time interval t1, then a touch event is determined to have occurred for the associated touch area. In one embodiment, time interval t1 may be 250 milliseconds.

Inadvertent actuation may occur in capacitive touch circuitry applications. Inadvertent actuation may be exacerbated by environmental factors such as rain, frost, and condensation. In some instances, a user may touch one touch area and moisture on the touch areas may cause cross-talk with another touch area. An output voltage indicating a touch event on two touch areas may be provided.

To address such inadvertent actuation from cross-talk, touch sensing systems may utilize a touch area suppression algorithm. In one embodiment, a touch area suppression algorithm may identify signals that exceed a detection threshold for a necessary time interval, and compare such signals to each other to determine which signal exceeds the negative detection threshold by the largest difference. The touch area suppression algorithm may select the strongest signal, e.g., the signal that exceeds the detection threshold by the largest difference, and ignore the weaker signal. The touch area suppression algorithm may thus enable only one touch area to be detected at a time.

Figure 15:
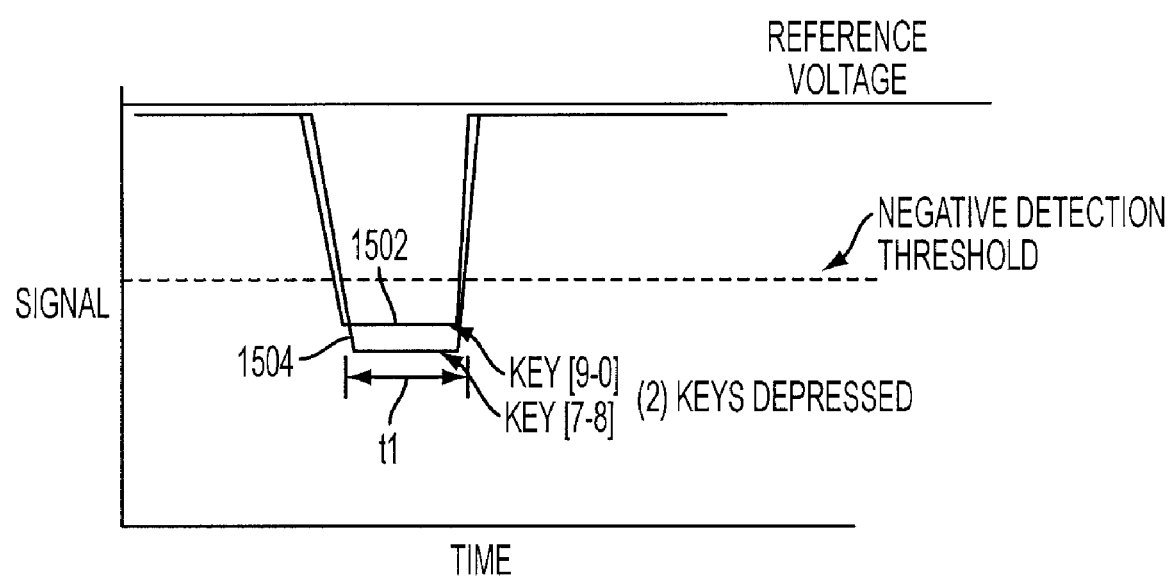
FIG. 15 includes of plots of voltage vs. time for the outputs of two different touch sensors.

In applications where two touch areas must be simultaneously touched in order to initiate a particular function, it may be necessary to detect simultaneous touching of the touch areas. For example, in a keyless entry system application the system may be configured to allow locking all doors of a vehicle by simultaneously touching the fourth touch area 426 having numerals [7-8] and the fifth touch area 428 having numerals [9-0]. Such an operation may be prevented by a conventional touch area suppression algorithm, which may select only the strongest signal from one, but not both, touch areas. FIG. 15, for example, includes plots 1502, 1504 of voltage vs. time for capacitive touch sensors associated with the touch areas 428 and 426, respectively. In the illustrated embodiment, if touch areas 428 and 426 were simultaneously touched, a conventional touch area suppression algorithm may select the strongest signal, i.e. from touch area 426, and ignore the weaker signal from touch area 428.

Figure 16:
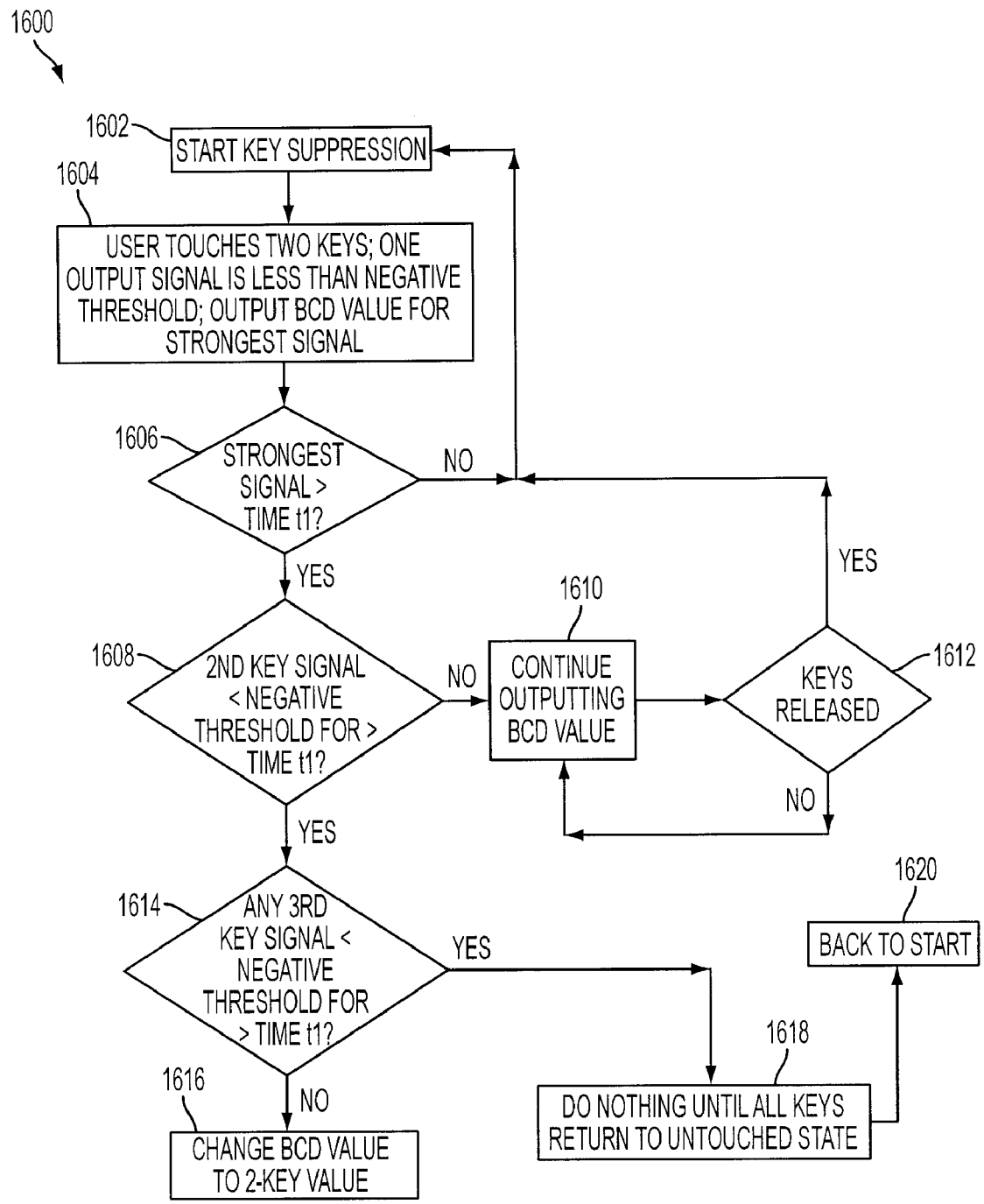
FIG. 16 is a flow chart of operations consistent with an embodiment to enable a multiple touch area command.

FIG. 16 is a flow chart of operations 1600 of a algorithm consistent with an embodiment of the invention to enable a multiple touch area command while still utilizing a conventional touch area suppression feature. The flow charts set forth herein may include particular sequences of steps. It can be appreciated, however, that the sequence of steps merely provides an example of how the general functionality described herein can be implemented. Further, each sequence of steps does not have to be executed in the order presented unless otherwise indicated.

Also, it will be appreciated that the functionality described for the embodiments of the invention may be implemented by a controller, e.g. controller 302, or other system component using hardware, software, or a combination of hardware and software, and well-known signal processing techniques. If implemented in software, a processor and machine-readable medium is required. The processor may be any type of processor capable of providing the speed and functionality required by the embodiments of the invention. For example, the processor could be a processor from the Pentium® family of processors made by Intel Corporation, or the family of processors made by Motorola. Machine-readable media include any media capable of storing instructions adapted to be executed by a processor. Some examples of such media include, but are not limited to, read-only memory (ROM), random-access memory (RAM), programmable ROM (PROM), erasable programmable ROM (EPROM), electronically erasable programmable ROM (EEPROM), dynamic RAM (DRAM), magnetic disk (e.g. floppy disk and hard drive), optical disk (e.g. CD-ROM), and any other device that can store digital information. In one embodiment, the instructions are stored on the medium in a compressed and/or encrypted format.

As used herein, the phrase "adapted to be executed by a processor" is meant to encompass instructions stored in a compressed and/or encrypted format, as well as instructions that have to be compiled or installed by an installer before being executed by the processor. Further, the processor and machine-readable medium may be part of a larger system that may contain various combinations of machine-readable storage devices through various I/O controllers, which are accessible by the processor and which are capable of storing a combination of computer program instructions and data.

With reference to FIG. 16, operation 1602 may start or enable a conventional touch area suppression algorithm. In operation 1604, a user may simultaneously touch two touch areas. If the associated signal for each touch area is below the negative detection threshold, then the touch area suppression algorithm may output a binary coded decimal (BCD) value for the particular touch area having the strongest signal. For example, assuming the two touch areas touched were the fourth touch area 426 having numerals [7-8] and the fifth touch area 428 having numerals [9-0] and the results were as depicted in FIG. 15, operation 1604 would determine that the signal associated with the fourth touch area 426 is stronger than the signal associated with the fifth touch area 428. Accordingly, the BCD value for the fourth touch area would be provided. Each touch area may have an associated BCD value and the BCD value for the fourth touch area 426 may be "110."

Operation 1606 may determine if the strongest signal from operation 1604 is below the negative detection threshold for a specified time interval t1. In one embodiment, time t1 may be 250 milliseconds. If not, the operations may cycle back to operation 1602. If the strongest signal is less than the negative detection threshold for the specified time interval, then operation 1608 may check if another signal associated with a second touch area is also less than the negative detection threshold for the specified time interval. If not, then operation 1610 may continue to output the BCD value of operation 1604 until the touch area is released 1612.

If the second signal is also less than the negative detection threshold for the specified time interval, then operation 1614 may check if any other signal from any other third touch area also meets these criteria. If not, then the initial BCD value first output in operation 1604 may be changed to the BCD value associated with a particular function for the two touch areas simultaneously touched. For example, if the fourth touch area 426 having numerals [7-8] and the fifth touch area 428 having numerals [9-0] are simultaneously touched the BCD code value output in operation 1604 (e.g., "110") would change to the BCD code value to lock all doors, e.g., "100." If another signal associated with a third touch area is also less than the negative detection threshold for the specified time interval, then operation 1618 would do nothing and not output a BCD value until all touch areas returned to an untouched state and then would cycle back to start 1620.

Therefore, if both touch areas are touched resulting in associated signals, e.g., signals 1502 and 1504 of FIG. 15, that less than negative detection threshold for a specified time interval, e.g., time t1, then the associated function would be implemented. This could be the automatic locking feature for all doors if the fourth touch area 426 and the fifth touch area 428 are touched simultaneously. This improves the ability of the touch sensor assembly to address inadvertent touch area actuation from cross-talk while also allowing multiple touch area functions to be implemented. Although the above operations 1600 are detailed with respect to pressing two touch areas simultaneously, those skilled in the art will recognize that similar operations could be performed to check for simultaneous touching of three or more touch areas.

Another example of a multiple touch area command in a touch sensor assembly is the enable/disable of an auto lock feature. In this example, the user may first touch and hold the fourth touch area 426 having numerals [7-8]. The BCD value associated with the fourth touch area may be output and the user may then touch the second touch area 422 having numerals [3-4] while still simultaneously touching the fourth touch area 426. If both the signals for the second 422 and fourth touch areas 426 are less than the negative detection threshold for the specified time interval, the BCD value for the second step of the auto lock enable/disable feature may be output even if the touch area suppression algorithm is enabled.

Figure 17:
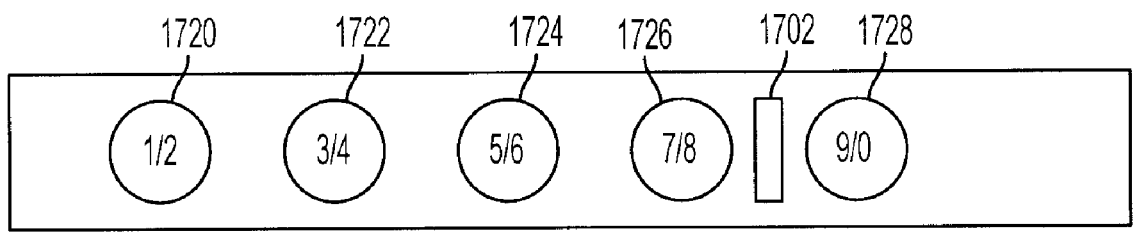
FIG. 17 illustrates another embodiment having a reference electrode disposed between two touch areas.

FIG. 17 illustrates another embodiment consistent with the present invention having a reference electrode incorporated into the touch sensor assembly and disposed between two touch areas. The reference electrode may be disposed between any two of the five touch areas 1720, 1722, 1724, 1726, or 1728 that may be touched simultaneously to activate a desired function. In the embodiment of FIG. 17, the reference electrode 1702 is illustrated between the fourth touch area 1726 having numerals [7-8] and the fifth touch area 1728 having numerals [9-0].

Figure 18:
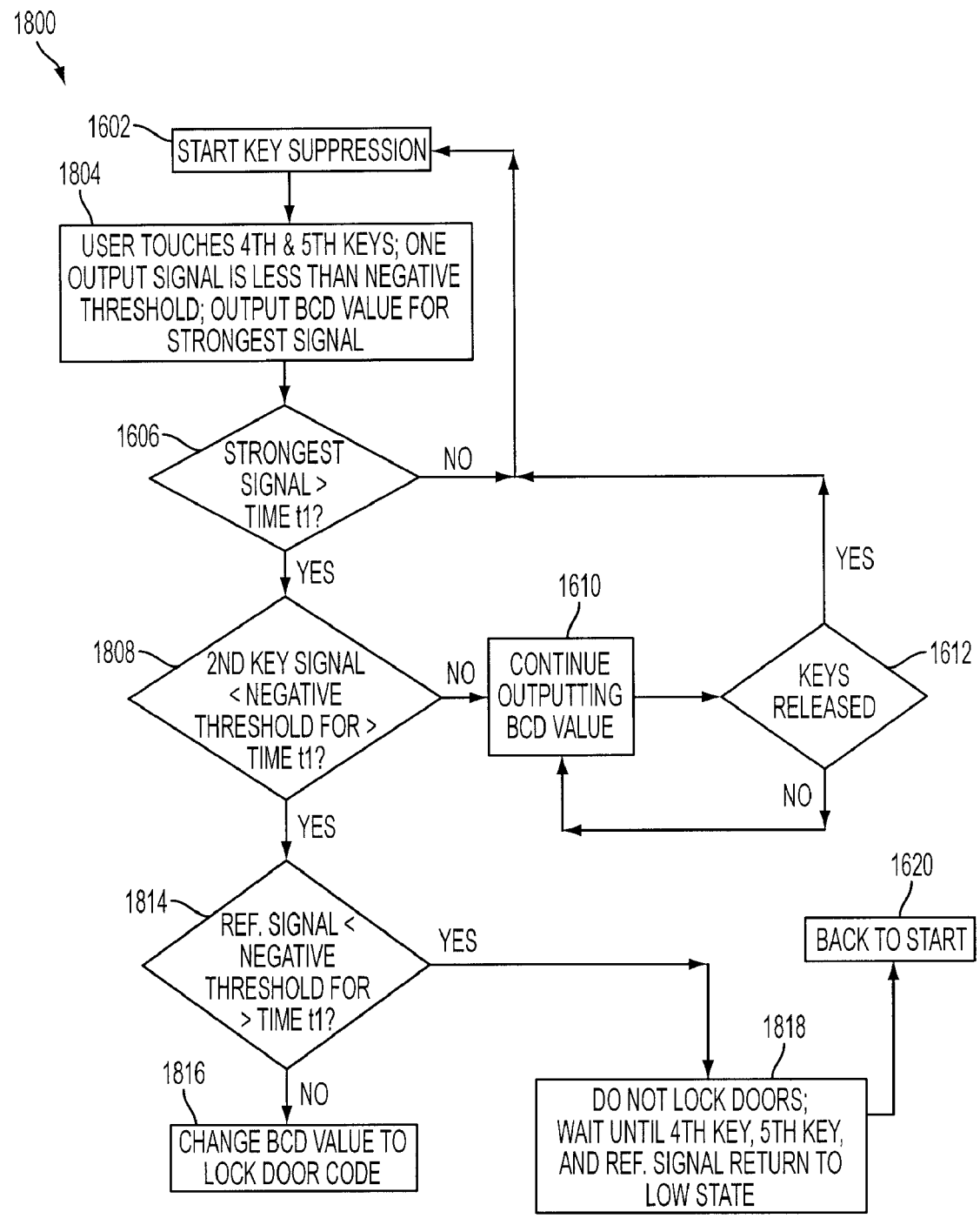
FIG. 18 is a flow chart of operations consistent with another embodiment utilizing the reference electrode of FIG. 17 to enable a multiple touch area command.

FIG. 18 illustrates flow chart of an algorithm associated with the touch sensor assembly of FIG. 17 having the reference electrode 1702 disposed between the fourth touch area 1726 and fifth touch area 1728. Many operations of the algorithm of FIG. 18 are similar to FIG. 16 and are labeled as such. Accordingly, any repetitive descriptions are omitted herein for clarity. The main difference comparing operations 1800 to operations 1600 are that operations 1800 use a reference signal from the reference electrode 1702 and are for two specific touch areas (the fourth touch area 1726 and fifth touch area 1728) and a specific door lock function, as opposed to generic touch areas and a generic function of operations 1600.

If all three signals associated with the fourth touch area 1728, fifth touch area 1728, and the reference electrode 1702 are less than a negative detection threshold for the specified time interval t1, then the doors do not lock 1818 and the system waits until the signals associated with the fourth touch area 1726, the fifth touch area 1728, and the reference electrode 1702 return to a low state. If the fourth signal and fifth signal are less than the negative detection threshold for the specified time interval t1, and the reference signal is not, then the BCD value is changed to the lock door code 1816. Thus, the reference electrode 1702 and its associated signal further protect against an inadvertent operation of a multi touch area operation such as the door lock operation.

Inadvertent actuation of touch areas and lack of tactile feedback for a user are considerations when designing touch sensor assemblies utilizing capacitive sensing circuitry. Inadvertent actuation of touch areas may occur if a person passes their finger over touch areas when trying to locate an intended touch area. It would be desirable to prevent actuation of the functions associated with the unintended touch areas as the user attempts to locate the intended touch area. This inadvertent actuation may be more likely to occur in a system application where there are multiple touch areas in close proximity to one another. Providing tactile feedback to the user to indicate that the touch area has been selected may also be desirable in certain instances.

Figure 19:
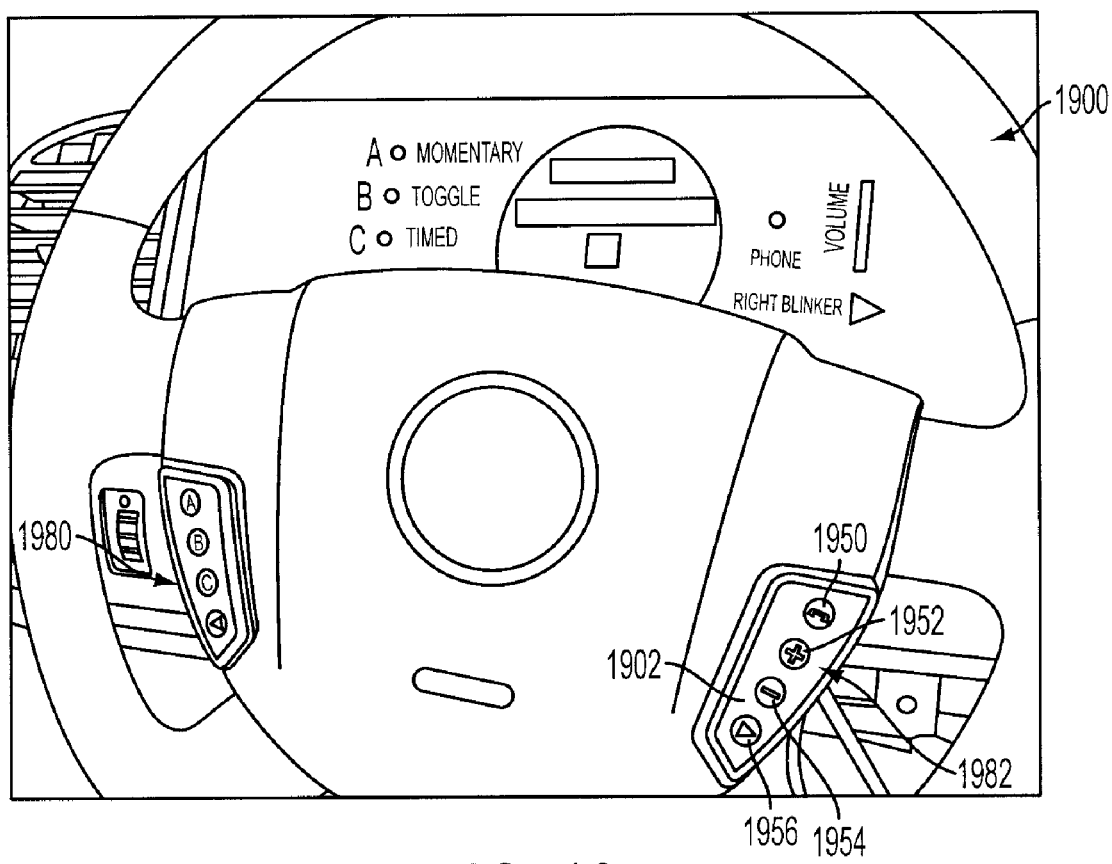
FIG. 19 is a perspective view of a steering wheel and a portion of an instrument panel.

FIG. 19 illustrates another embodiment of the present invention to address inadvertent actuation of touch areas and to provide tactile feedback to a user when using a touch sensor assembly having capacitive sensing circuitry. Those skilled in the art will recognize many other system applications. The system of FIG. 19 includes touch sensor assemblies 1980 and 1982 coupled to a steering wheel 1900 of a vehicle. The right touch sensor assembly 1982 may include a first touch area 1950 for a phone, a second touch area 1952 for an increase in radio volume, a third touch area 1954 for a decrease in radio volume, and a fourth touch area 1956 for a right blinker of the vehicle. Advantageously, the sensor cover 1902 of the right touch sensor assembly 1982 may have a raised portion over each touch area 1950, 1952, 1954, and 1956. The raised portion of the sensor cover 1902 may be in the form of a raised dome.

Figure 20:
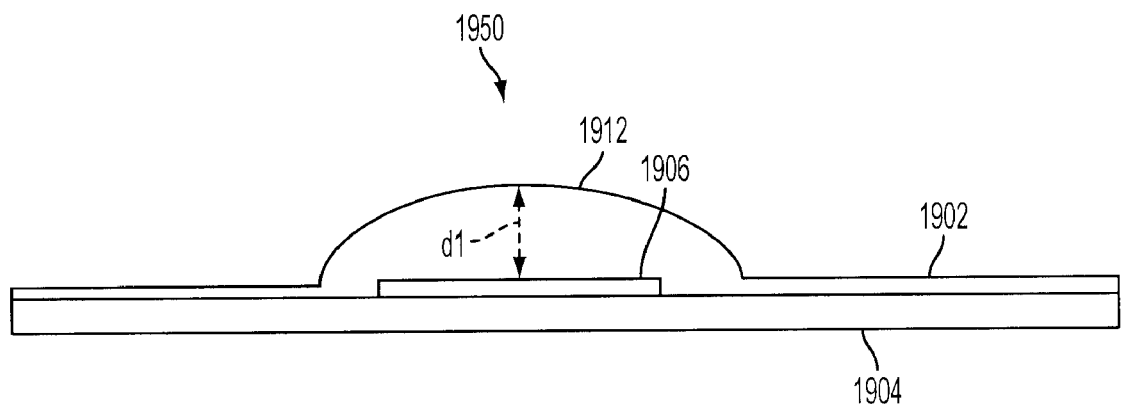
FIG. 20 is a cross-sectional view of the raised dome of the sensor cover of FIG. 19.

FIG. 20 is a cross-sectional view of a raised dome 1912 of the sensor cover 1902 for the first touch area 1950. The raised dome portion 1912 of the sensor cover 1902 may have a height dl above the touch sensor 1906 of the associated touch sensor for that touch area 1950. Therefore, if a user passes a finger or other object over the raised dome 1912 the height dl of the raised dome will maintain the user's finger a sufficient distance from the touch sensor 1906 to help avoid an inadvertent actuation of the first touch area 1950 function.

Figure 21:
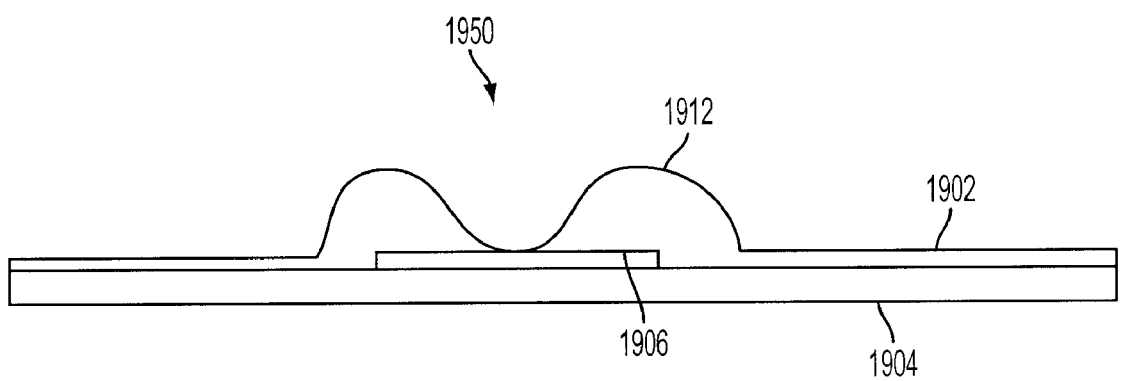
FIG. 21 is a representational cross-sectional view of the raised dome of the sensor cover of FIG. 19 in a depressed position.

FIG. 21 illustrates a representational view of the raised dome 1912 of FIG. 20 in a depressed or deformed position when the first touch area 1950 is the intended touch area to be selected by the user. When a user applies downward pressure to the raised dome 1912, the raised dome 1912 temporarily collapses to allow the actuation of the first touch area 1950 function. When the user removes the pressure, the raised dome 1912 may return to its position of FIG. 20. In addition to enhancing protection against inadvertent actuation of touch areas, the raised dome 1912 may also advantageously provide tactile feedback to a user. The raised dome 1912 may be incorporated into the sensor cover 1902 to minimize components. Alternatively, the raised dome 1912 may be provided as a separate structure from the sensor cover 1902.

Figure 22:
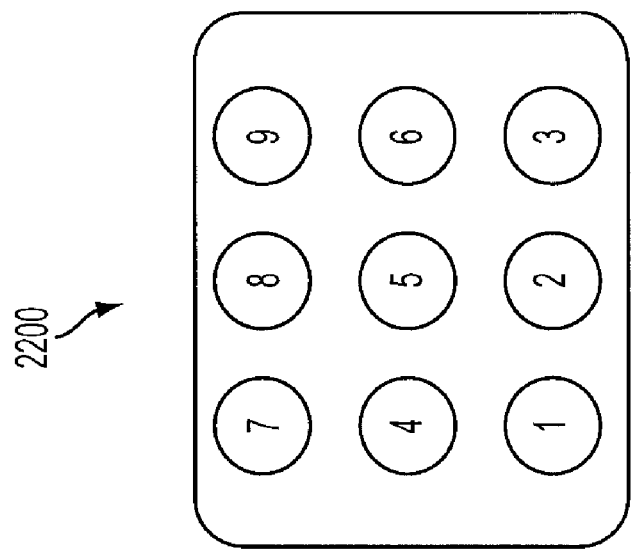
FIG. 22 is a diagram of a touch area pad consistent with another embodiment.

FIG. 22 illustrates a touch area pad 2200 having a plurality of touch areas for numerals 1-9. Each touch area may have an associated touch sensor located beneath the touch area. The proximity of the touch areas to each other may cause outputs from touch sensors associated with unintended touch areas as a user moves to touch an intended touch area. For example, a user may intend to touch area numeral 5 and may pass by touch area numerals 4 and 7 before reaching touch area numeral 5. A touch sensor associated with numerals 4 and 7 may detect a change in capacitance. Even if a user touches a touch area on the outside perimeter of the touch area pad 2200, e.g., adjacent touch area numeral 7, other circuitries associated with other touch areas may exhibit a sensed change in capacitance.

Figure 23:
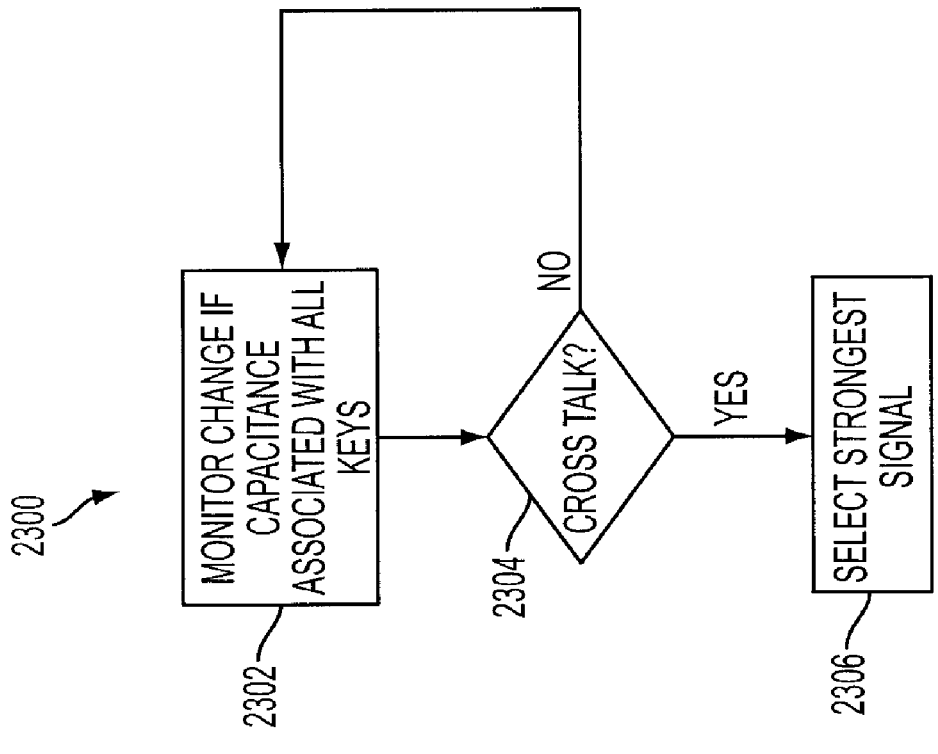
FIG. 23 is a flow chart of operations associated with the touch area pad of FIG. 22.

FIG. 23 illustrates operations 2300 of an algorithm consistent with another embodiment to assist with inadvertent actuation of touch areas in systems such as the touch area pad of FIG. 22. Operation 2302 may monitor the change in capacitance for circuitries associated with all touch areas, e.g., all touch area numerals 1-9 of FIG. 22. Operation 2304 may analyze if any cross-talk is occurring. Cross-talk may be, for example, a change in capacitance of any two or more capacitive touch sensing circuitries. If no cross-talk is occurring, then no signal is output and the operations 2300 continue to monitor the change in capacitance associated with all the touch areas. If there is cross-talk, then the strongest signal is determined and the function or output associated with the strongest signal may be executed 2306. For example, during a touch of intended touch area numeral 5, some neighboring touch areas may have associated circuitries that sense a higher than normal change in capacitance. The change in capacitance for those circuitries may not be as high as the change in capacitance for the intended touch area numeral 5 which therefore helps confirm that touch area numeral 5 is the intended touch area.

Figure 24:
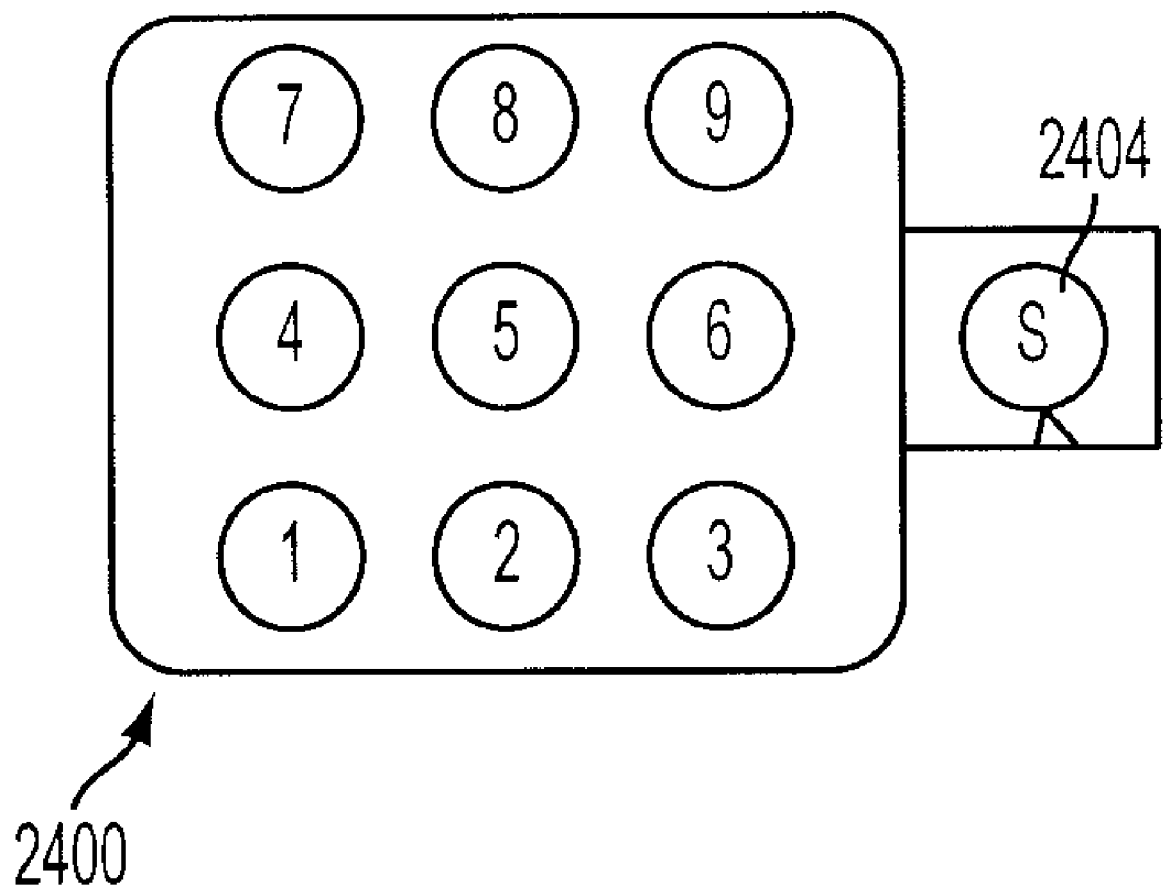
FIG. 24 is a diagram of a touch area pad and a switch of yet another embodiment.

FIG. 24 illustrates yet another embodiment consistent with the present invention having a touch area pad 2400 coupled to an electromechanical switch 2404. In the embodiment of FIG. 24, a user would make a selection of one of the touch areas for numerals 1-9 using the touch area pad 2400. The touch area pad 2400 may provide feedback, e.g., audio or visual, to the user to indicate the selected touch area. If highlighted selected touch area is indeed the intended touch area, the user may then press the electromechanical switch 2404 for final activation of the selected touch area. The electromechanical switch 2404 may therefore provide another measure against unintended switch activations.

In summary, there is provided a touch sensor assembly. The touch sensor assembly may include a housing, a circuit board configured to be received at least partially in the housing, at least one touch sensor coupled to the circuit board, and a sensor cover configured to be received at least partially in the housing with the circuit board disposed between the housing and the sensor cover. The sensor cover includes a graphical indicator of a touch area associated with the at least one touch sensor. The housing includes a mating feature configured to mate with a corresponding feature on a rear surface of an housing cover to provide a substantially water tight cavity for enclosing the circuit board and the sensor cover between the housing and the housing cover.

According to another aspect, there is provided a touch sensor assembly including a touch sensor configured to provide an output in response to contact with a touch area, and a raised dome portion positioned over the touch area. The raised dome may be configured to provide tactile feedback to a user if the user depresses the raised dome.

According to another aspect, there is provided a touch sensor assembly including a touch sensor configured to provide an output in response to contact with a touch area, a sensor cover configured to at least partially cover the touch sensor, the sensor cover including a graphical indicator identifying a position of the touch area; and at least one conductor coupling the sensor cover to the touch sensor.

According to yet another aspect, there is provided a touch sensor assembly including a touch sensor configured to provide an output in response to contact with a touch area, a sensor cover configured to at least partially cover the touch sensor and including a graphical indicator identifying a position of the touch area, a controller; and a light emitting diode (LED). The LED is configured to illuminate at least a portion of the touch area and to sense an ambient light level adjacent the touch area. The controller is configured to control an illumination level provided by the LED in response to the sensed ambient light level.

According to yet another aspect there is provided a method of monitoring a plurality of touch areas of a touch sensor assembly. The method may include: identifying a first signal of a plurality of signals that exceeds a threshold level for a first time interval, each one of the plurality of signals corresponding to a different one of the plurality of touch areas, the first signal corresponding to a first touch area of the plurality of touch areas; providing a first output signal associated with the first signal; identifying a second signal of the plurality of signals that also exceeds the threshold level for the first time interval, the second signal corresponding to a second touch area of the plurality of touch areas; and changing the first output signal to a second output signal associated with a simultaneous touching of the first touch area and the second touch area if no other of the plurality of signals exceeds the threshold level for the first time interval.

According to yet another aspect there is provided a method of monitoring a plurality of touch areas of a touch sensor assembly. The method may include: identifying a first signal of a plurality of signals that exceeds a threshold level for a first time interval, each one of the plurality of signals corresponding to a different one of the plurality of touch areas, the first signal corresponding to a first touch area of the plurality of touch areas; providing a first output signal associated with the first signal; identifying a second signal of the plurality of signals that also exceeds the threshold level for the first time interval, the second signal corresponding to a second touch area of the plurality of touch areas; and changing the first output signal to a second output signal associated with a simultaneous touching of the first touch area and the second touch area if a reference signal corresponding to a reference electrode does not exceed the threshold level for the first time interval.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

What is claimed is:

1. A touch sensor assembly comprising:
   a housing;
   a circuit board configured to be received at least partially in said housing;
   at least one light emitting diode (LED) coupled to said circuit board;
   at least one touch sensor coupled to said circuit board; and
   a sensor cover configured to be received at least partially in said housing with said circuit board disposed between said housing and said sensor cover, said sensor cover comprising a graphical indicator of a touch area associated with said at least one touch sensor,
   said housing comprising a mating feature configured to mate with a corresponding feature on a rear surface of an housing cover to provide a substantially water tight cavity for enclosing said circuit board and said sensor cover between said housing and said housing cover,
   said housing cover comprising a translucent material configured to obscure said graphical indicator so that it is not readily visible unless said LED is illuminated.

2. The touch sensor assembly of claim 1, wherein said mating feature comprises a slot extending about a perimeter of said housing, and wherein said corresponding feature of said housing cover comprises a projection, said slot configured to accept said projection to provide said substantially water tight cavity.

3. The touch sensor assembly of claim 2, wherein said projection comprises an upstanding wall defining a closed geometry.

4. The touch sensor assembly of claim 2, wherein an adhesive is at least partially disposed within said slot.

5. The touch sensor assembly of claim 1, wherein said at least one light emitting diode (LED) is mounted to a bottom surface of said circuit board and configured for illuminating said touch area.

6. The touch sensor assembly of claim 1, said assembly comprising a plurality of said touch sensors coupled to said circuit board, and a plurality of said graphical indicators, each of said graphical indicators being associated with one of said touch sensors, said assembly further comprising a plurality of said light emitting diodes (LEDs), each of said LEDs being mounted to said bottom surface of said circuit board, each of said LEDs being configured for illuminating an associated one of said touch areas.

7. The touch sensor assembly of claim 1, wherein said graphical indicator is provided on a raised dome portion of said sensor cover, said raised dome portion being positioned to be disposed over said touch sensor upon assembly of said circuit board and said sensor cover to said housing.

8. The touch sensor assembly of claim 1, wherein said touch sensor comprises capacitive circuitry configured to exhibit a capacitance responsive to contact with said touch area.

9. The touch sensor assembly of claim 1,
   wherein said touch sensor comprises a variable capacitance that changes in response to contact with said touch area to establish an associated output voltage to be used by a controller for determining if said touch area has been touched by a user; and
   a raised dome portion positioned over said touch area, said raised dome portion being configured to deform into contact with said touch sensor upon application of a force to said raised dome portion toward said touch sensor and being configured to return to a non-deformed state when said force is removed,
   said raised dome having height above said touch sensor in said non-deformed state great enough so that said touch sensor will not provide said output unless said raised dome is deformed into said deformed state by said force.

10. The touch sensor assembly of claim 1, wherein said at least one touch sensor comprises variable capacitance that changes in response to contact with a touch area to establish an associated output voltage to be used by a controller for determining if said touch area has been touched by a user.

11. The touch sensor assembly of claim 1, said assembly further comprising:
    at least one conductor coupling said sensor cover to said touch sensor.

12. The touch sensor assembly of claim 11, said sensor cover having a bottom surface spaced a distance from an illuminating surface of said LED, said distance selected to provide a desired illumination coverage area by said LED on said touch area.

13. The touch sensor of claim 12, wherein said touch sensor is coupled to said circuit board, and wherein said LED is coupled to a bottom surface of said circuit board.

14. The touch sensor assembly of claim 1, said assembly further comprising:
    a controller,
    wherein said light emitting diode (LED) is configured to illuminate at least a portion of said touch area and to sense an ambient light level adjacent said touch area, said controller configured to control an illumination level provided by said LED in response to said sensed ambient light level.

15. The touch sensor assembly of claim 14, wherein said illumination level provided by said LED is at a first illumination level for a first ambient light level and at a second illumination level for a second ambient light level, said first ambient light level greater than said second ambient light level, and said first illumination level greater than said second illumination level.

16. The touch sensor assembly of claim 14, wherein said LED is coupled to a bottom surface of said circuit board.

17. The touch sensor assembly of claim 9, further comprising a reference electrode disposed adjacent said at least one touch sensor.

18. The touch sensor assembly of claim 14, further comprising a reference electrode disposed adjacent said touch sensor, configured to prevent said output based on a signal from said electrode.

* * * * *